US008088688B1

(12) United States Patent
Herner

(10) Patent No.: US 8,088,688 B1
(45) Date of Patent: Jan. 3, 2012

(54) P+ POLYSILICON MATERIAL ON ALUMINUM FOR NON-VOLATILE MEMORY DEVICE AND METHOD

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 12/940,920

(22) Filed: Nov. 5, 2010

(51) Int. Cl.
H01L 21/44 (2006.01)
H01L 29/02 (2006.01)
H01L 29/40 (2006.01)
(52) U.S. Cl. ............ 438/658; 438/660; 438/688; 257/2; 257/771
(58) Field of Classification Search .................. None
See application file for complete search history.

(56) References Cited

U.S. PATENT DOCUMENTS

2010/0084625 A1* 4/2010 Wicker et al. .................. 257/4
* cited by examiner Primary Examiner — Scott B Geyer
(74) Attorney, Agent, or Firm — Ogawa P.C.

(57) ABSTRACT

A method of forming a non-volatile memory device. The method includes providing a substrate having a surface region and forming a first dielectric material overlying the surface region. A first wiring material comprising at least an aluminum material is formed overlying the first dielectric material. The method forms a silicon material overlying the aluminum material and forms an intermix region consuming a portion of the silicon material and a portion of the aluminum material. The method includes an annealing process to cause formation of a first alloy material from the intermix region and a polycrystalline silicon material having a p+ impurity characteristic overlying the first alloy material. A first wiring structure is formed from at least a portion of the first wiring material. A resistive switching element comprising an amorphous silicon material is formed overlying the polycrystalline silicon material having the p+ impurity characteristic. A second wiring structure comprising at least a metal material is formed overlying the resistive switching element.

25 Claims, 8 Drawing Sheets

P+ POLYSILICON MATERIAL ON ALUMINUM FOR NON-VOLATILE MEMORY DEVICE AND METHOD

CROSS REFERENCE TO RELATED APPLICATIONS

Not Applicable

STATEMENT RELATED TO FEDERAL OR GOVERNMENT SPONSORED RESEARCH

Not Applicable

BACKGROUND

The present invention is directed to switching devices. More particularly, embodiments according to the present invention provide a method and a device structure for a resistive switching device. The resistive switching device can be used as a non-volatile memory device but it should be recognized that the present invention can have a much broader range of applicability.

The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching for a PCRAM device requires large amounts of power. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is directed to switching devices. More particularly, embodiments according to the present invention provide a method and a device structure for a resistive switching device. The resistive switching device can be used as a non-volatile memory device but it should be recognized that the present invention can have a much broader range of applicability.

In a specific embodiment, a method of forming a non-volatile memory device is provided. The method includes providing a semiconductor substrate having a surface region. A first dielectric material is formed overlying the surface region. The method includes forming a first wiring material overlying the first dielectric material. In a specific embodiment, the first wiring material includes at least an aluminum material. In a specific embodiment, a silicon material is formed overlying the first electrode material. The method includes forming an intermix region by consuming a portion of the silicon material and a portion of the aluminum material using at least an anneal process. In a specific embodiment, the annealing process causes formation of a first alloy material from the intermix region and a polycrystalline silicon material having a p+ impurity characteristic overlying the first alloy material. In a specific embodiment, the polycrystalline silicon material having the p+ impurity is derived from an aluminum species from the aluminum material and the silicon material. A resistive switching material comprising an amorphous silicon material is formed overlying the polycrystalline silicon material having the p+ impurity characteristic. The method forms second wiring material comprising at least a metal material overlying the resistive switching material in a specific embodiment.

In a specific embodiment, a non-volatile memory device is provided. The device includes a semiconductor substrate having a surface region and a first dielectric material overlying the surface region. The device includes a first wiring structure comprising at least an aluminum material overlying the first dielectric material. In a specific embodiment, a first alloy material formed from a silicon material and the aluminum material overlies the aluminum material, and a polycrystalline silicon material having a p+ impurity characteristic overlies the first alloy material. In a specific embodiment, the polycrystalline silicon material having the p+ impurity is derived from the silicon material and an aluminum species from the aluminum material. The device includes a resistive switching element comprising an amorphous silicon material overlying the polycrystalline silicon material having the p+ impurity characteristic, and a second wiring structure comprising at least a metal material overlying the resistive switching element.

Many benefits can be achieved by ways of the present invention over conventional techniques. For example, the present method forms a p+ polysilicon material by depositing a silicon material overlying aluminum and allows the aluminum material to diffuse into the silicon material to form the p+ polysilicon material in a specific embodiment. The present method eliminates at least an otherwise costly implantation process to form the p+ polysilicon material. Additionally, the present method further eliminates aluminum spiking in the polysilicon material as a result of annealing process to crystallize the silicon material at a high temperature of greater than about 600 Degree Celsius. More importantly, the present method can be achieved without modification to existing process equipment and techniques. Depending on the embodiment, one or more of these benefits may be achieved. One skilled in the art would recognize other variations, modifications, and alternatives.

DETAILED DESCRIPTION OF THE PRESENT INVENTION

Figure 1:
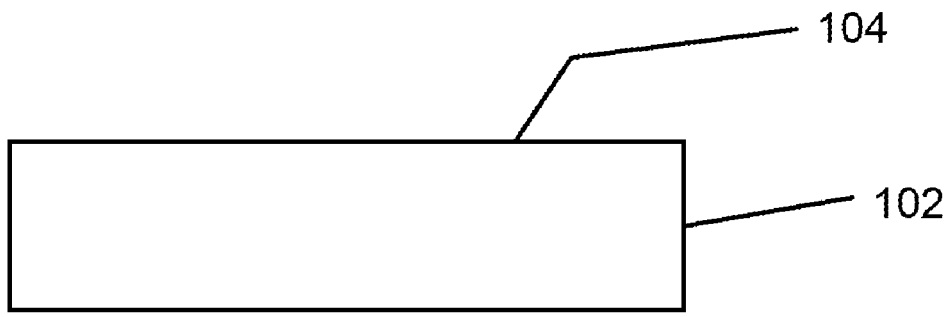
FIGS. 1-5 are simplified diagrams illustrating part of the steps of a conventional method of forming a non volatile memory device.
Figure 2:
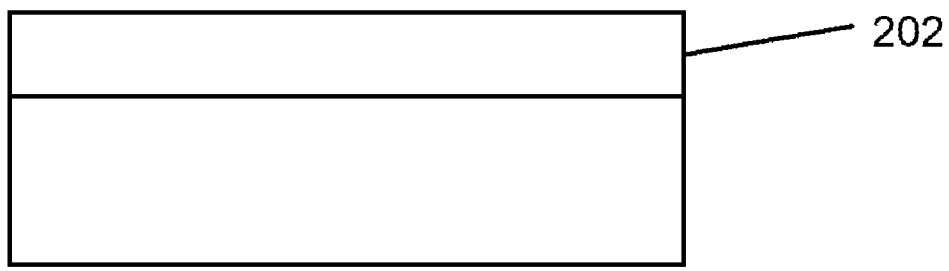
Figure 3:
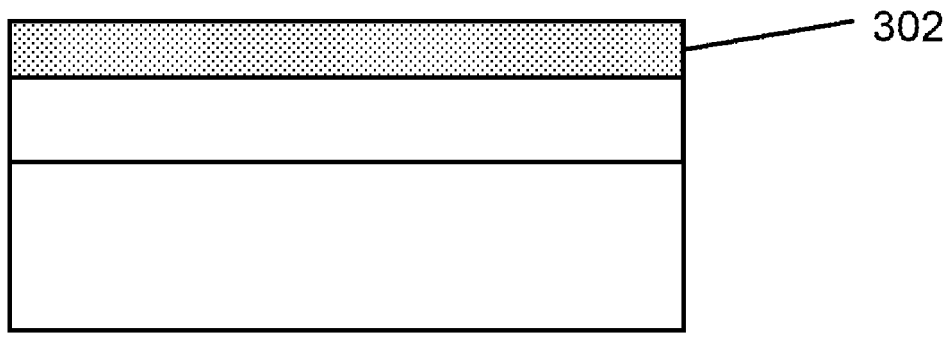
Figure 4:
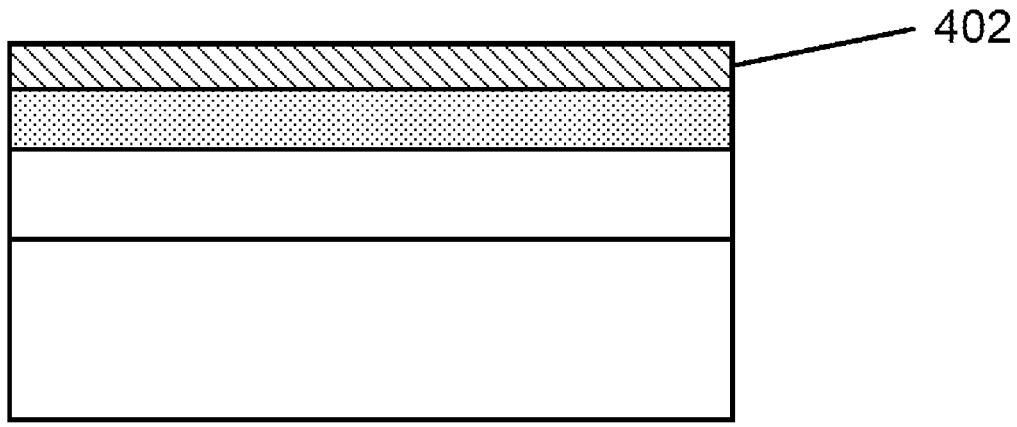
Figure 5:
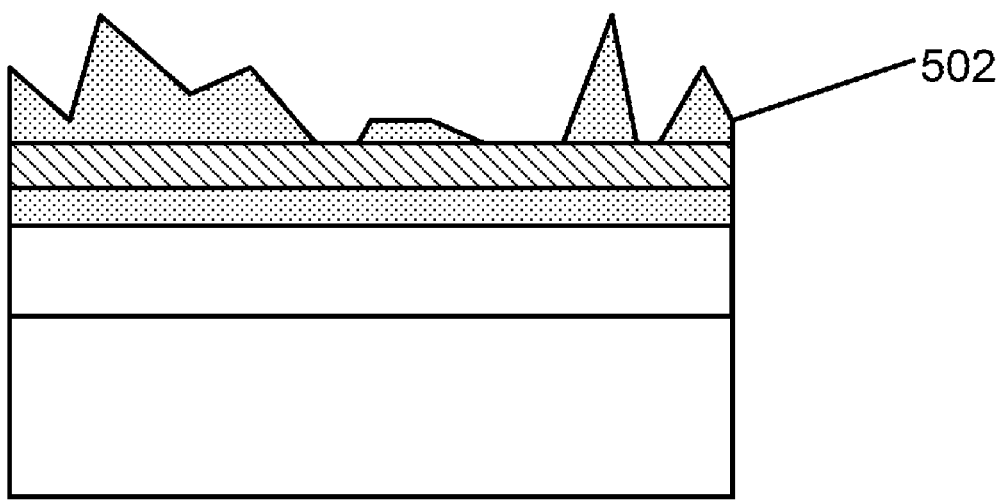

The present invention is directed to switching devices. More particularly, embodiments according to the present invention provide a method and a device structure for a resistive switching device. The resistive switching device can be used as a non-volatile memory device but it should be recognized that the present invention can have a much broader range of applicability FIGS. 1-5 illustrate part of the steps of a conventional method for forming a non volatile memory device. As shown, the conventional method includes provided a semiconductor substrate 102 having a surface region 104. The semiconductor substrate can be single crystal silicon, silicon on insulator, silicon germanium or other suitable material. A first dielectric material 202 is formed overlying a surface region of the semiconductor substrate. The first dielectric material can be silicon oxide or silicon nitride or a low K dielectric, or a high K dielectric or a dielectric stack depending on the application. The conventional includes depositing a first wiring material 302 overlying the first dielectric material. The first wiring material can be common metal materials used in CMOS processing. For example the first wiring material can be copper, aluminum or tungsten. In certain conventional method, the first wiring material is subjected to a pattern and etch process to form a first wiring structure. The conventional method then forms a p+ polysilicon material 402 overlying at least the first wiring structure. The p+ polysilicon material may be formed by co-depositing a silicon material with a suitable dopant using a chemical vapor deposition process. The chemical vapor deposition process can be low pressure chemical vapor deposition. Deposition temperature is usually greater than about 450 Degree Celsius to form crystalline silicon. For the first wiring electrode using aluminum material, temperature higher than about 450 Degree Celsius causes aluminum to spike through 502 the silicon material and forms undesirable conductive paths in the amorphous silicon layer. Other methods to obtain doped polycrystalline silicon material at temperatures less than 450 C include plasma enhanced chemical vapor deposition process of Si and/or the addition of germanium to the Si mixture. However these techniques usually require modifications to conventional tools and additional experimentation. Silicon germanium compositions with high germanium concentrations can be difficult to integrate into a stack structure, as they etch easily and are subject to undercut during etching.

Figure 6:
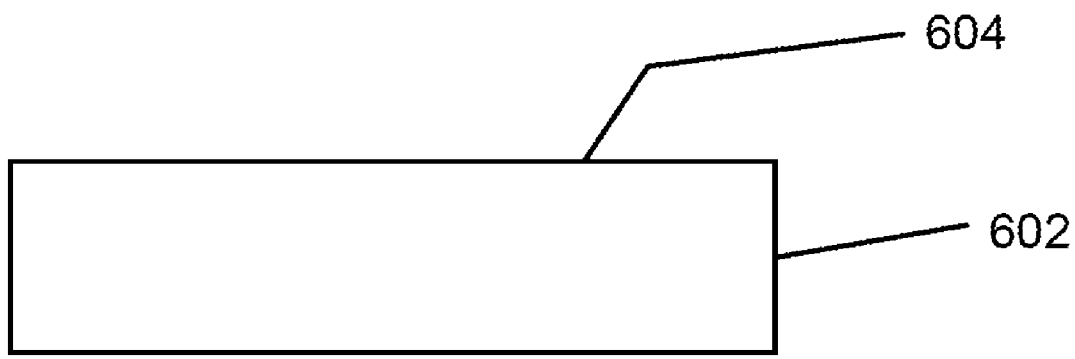
FIGS. 6-17 are simplified diagrams illustrating a method of forming a non volatile memory device according to an embodiment of the present invention.
Figure 7:
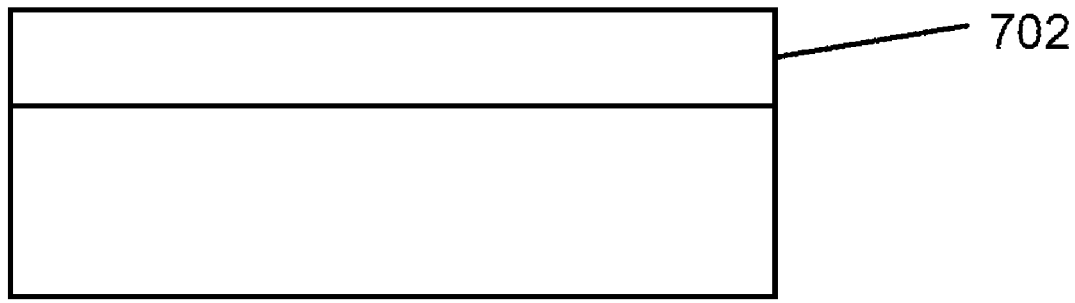
Figure 8:
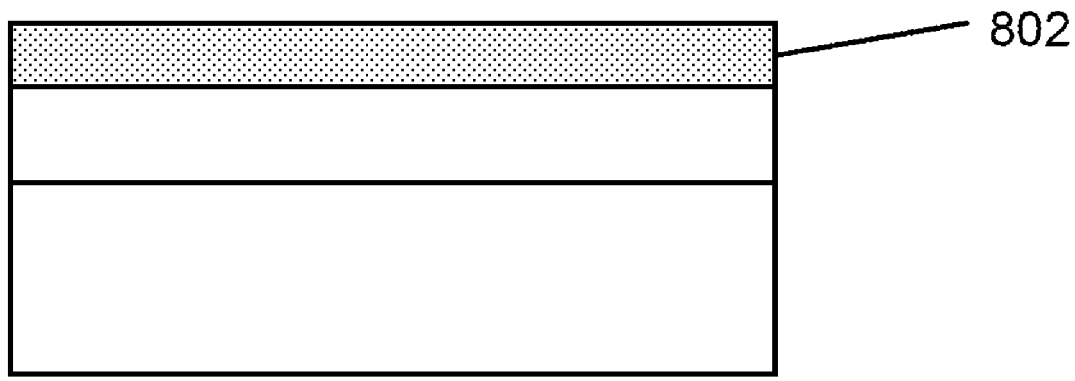

Embodiments according to the present invention provide a method to form p+ polysilicon material for fabrication of a non-volatile memory device. As shown in FIG. 6, a semiconductor substrate 602 having a surface region 604 is provided. The semiconductor substrate can be single crystal silicon, silicon on insulator, or silicon germanium depending on the application. The semiconductor substrate can have one or more transistor device formed thereon. The one or more transistor device provides control circuitry for the non-volatile memory device in a specific embodiment. A first dielectric material 702 is formed overlying the surface region of the semiconductor substrate. The first dielectric material can be silicon oxide, silicon nitride, a dielectric stack of alternating layers of silicon oxide and silicon nitride, a high K dielectric material, or a low K dielectric material depending on the embodiment.

The method includes forming a first wiring material 802 overlying the first dielectric material. The first wiring material is aluminum. The first wiring material can include one or more adhesive layer or diffusion barrier layer to promote adhesion between the metal material and the first dielectric material. In a specific embodiment, the first wiring material uses aluminum. Aluminum may be deposited using a physical vapor process. In other embodiments, aluminum may be deposited by a chemical vapor deposition process using precursors such as trimethyl aluminum (TMA) or dimethyl aluminum hydride (DMAH) usually in a hydrogen atmosphere. Other suitable precursors may also be used depending on the application. Deposition temperature can range from about 150 Degree Celsius to about 300 Degree Celsius depending on the precursors and deposition pressure used.

Figure 9:
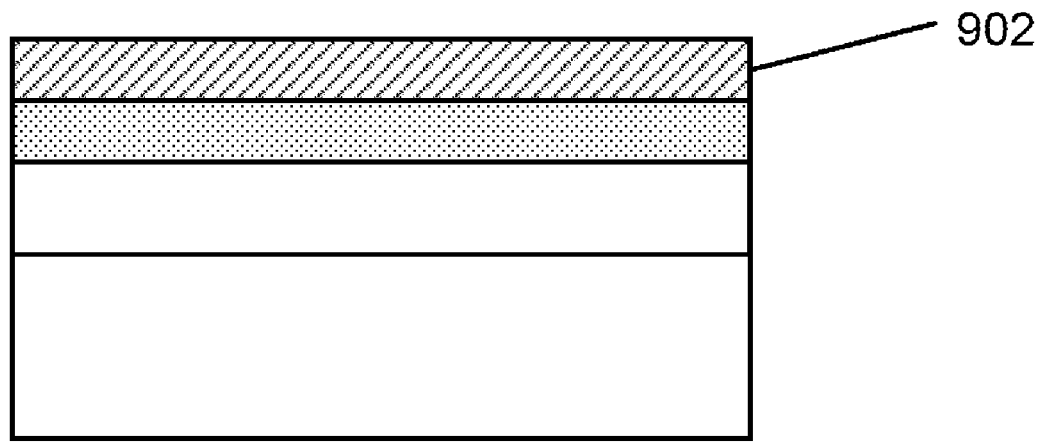

In a specific embodiment, the method includes depositing a silicon material 902 overlying aluminum as shown in FIG. 9. The silicon material can be formed using a chemical vapor process using silane as precursor. Deposition temperature can range from about 250 Degree Celsius to about 750 Degree Celsius. Depending on the temperature for deposition, the silicon material can be an amorphous silicon material, or a polysilicon material. Typically, a deposition temperature ranging from about 200 Degree Celsius to about 350 Degree Celsius would from an amorphous silicon material. Deposition temperature in the range of 350 Degree Celsius to about 750 Degree Celsius would result in a polycrystalline silicon material. Depending on the application, the silicon material can have a thickness ranging from about 0.1 um to about 1 um and less.

Figure 10:
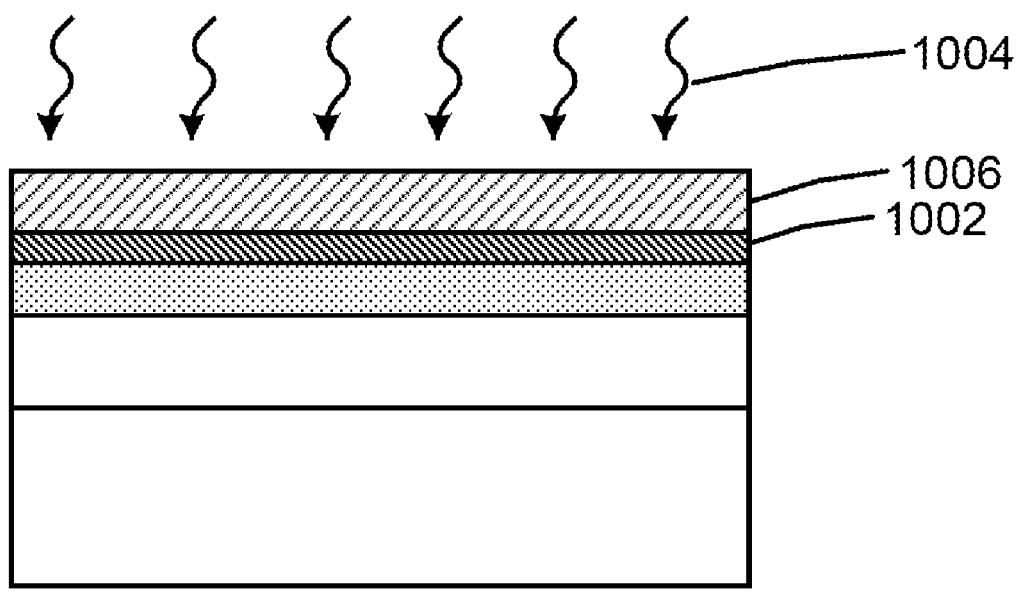

Referring to FIG. 10, the method forms an intermix region 1002 using an annealing process 1004 as shown in FIG. 10. In a specific embodiment, the annealing process is performed at a temperature ranging from about 600 Degree Celsius to about 900 Degree Celsius. The annealing process effectively melts the aluminum material allowing a certain amount of silicon material to dissolve in the melted aluminum material in the annealing process. The intermix region comprises the aluminum material and the silicon material in a specific embodiment. After cooling, an alloy material of silicon and aluminum material is formed in the intermix region from the silicon material and the aluminum material. The alloy material has a eutectic composition, which has about 11.3 percent of the silicon material and about 88.7 percent of the aluminum material by weight. Additionally, during cooling, a silicon material 1006 grows by way of liquid phase epitaxy overlies the alloy material. The silicon material is doped with aluminum and forms a polycrystalline silicon material having a p+ type impurity characteristic or a p+ polycrystalline silicon material after cooling. In a specific embodiment, the p+ type polycrystalline silicon material can have an aluminum concentration of about 10e18 atoms per $cm^3$ to about 10e20 atoms per $cm^3$ depending on the annealing time and annealing temperature, among others.

Figure 11:
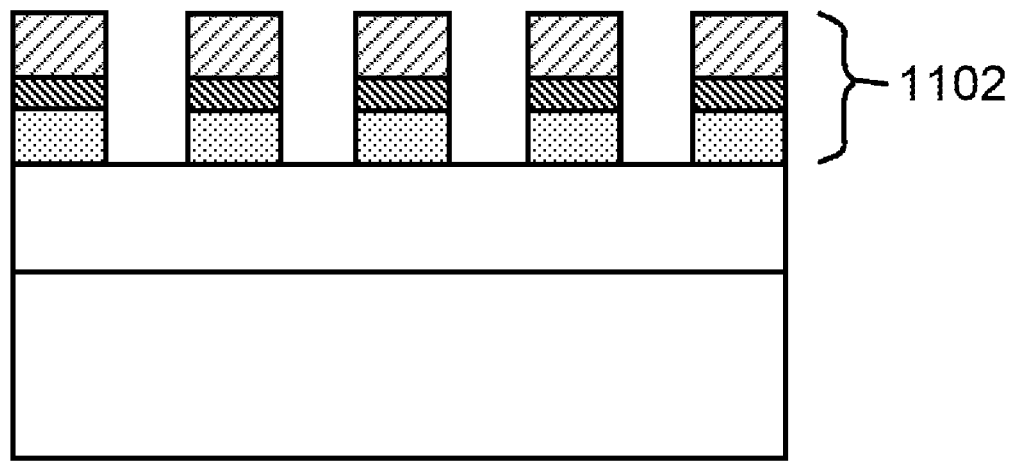

Referring to FIG. 11, the method subjects the aluminum material, the alloy material, and the polysilicon material to a first pattern and etch process to form a plurality of first structures 1102 overlying the first dielectric material. In a specific embodiment, each of the first structures including the aluminum material, the alloy material, and the polysilicon material, is elongated in shape and spatially disposed to orient in a first direction. Each of the first structures includes a first wiring structure comprising at least the aluminum material spatially extending in the first direction in a specific embodiment.

Figure 12:
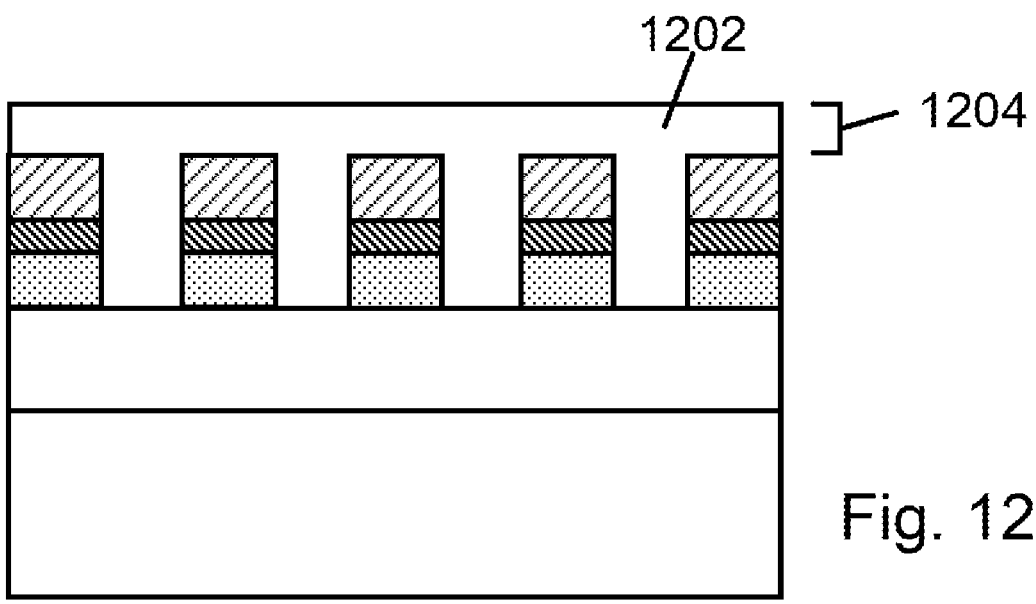

Referring to FIG. 12, the method includes depositing a second dielectric material 1202 overlying each of the plurality of the first structures to fill a plurality of gap regions formed from the first pattern and etch process. As shown in FIG. 12, the second dielectric material forms a thickness 1204 overlying each of the first structure in a specific embodiment.

Figure 13:
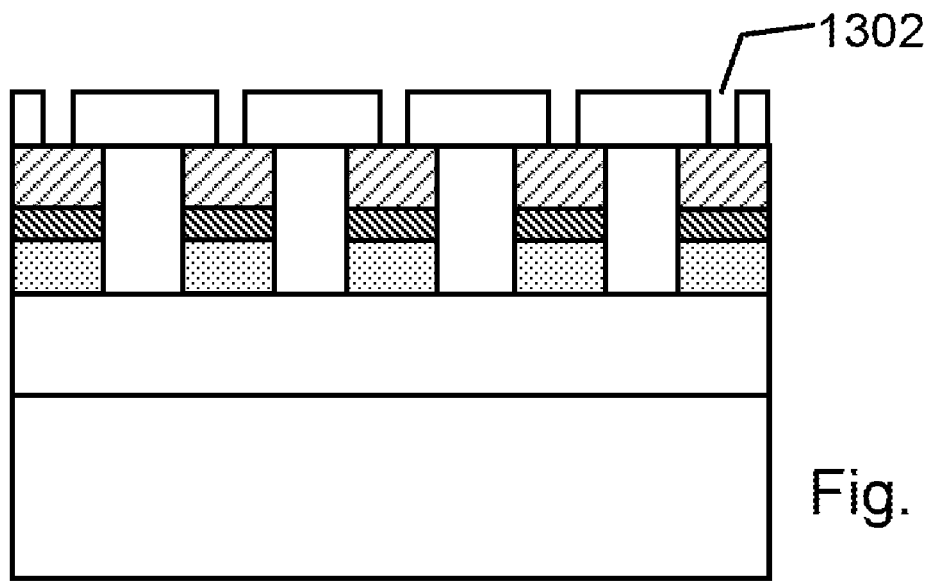
Figure 14:
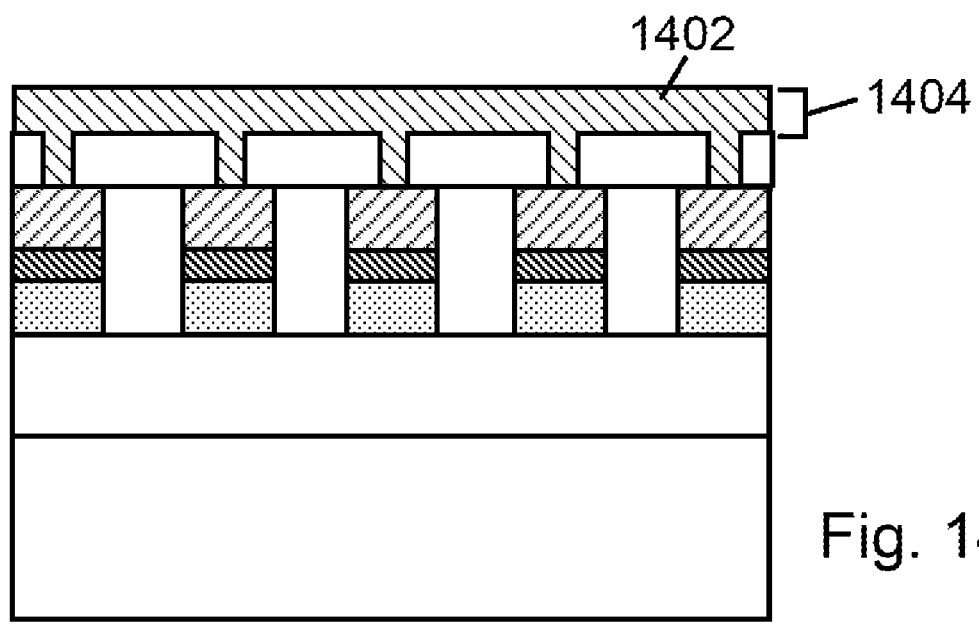

Referring to FIG. 13, the method subjects the second dielectric material to a second pattern and etch process to form a via opening to expose a portion of a surface region of the p+ polysilicon material of each of the first structure in a specific embodiment. In a specific embodiment, the method deposits a resistive switching material 1402 to fill the via opening and forms a thickness 1404 overlying the second dielectric material as shown in FIG. 14. In a specific embodiment, the resistive switching material is an amorphous silicon material. The amorphous silicon material is not deliberately doped in a specific embodiment. Depending on the application, the amorphous silicon material may be deposited using a chemical vapor deposition process using silane or a chlorosilane (for example, trichlorosilane or dichlorosilane in the presence of a hydrogen species) as a precursor. Alternatively, the amorphous silicon material may be deposited using a sputtering process from a silicon target.

Figure 15:
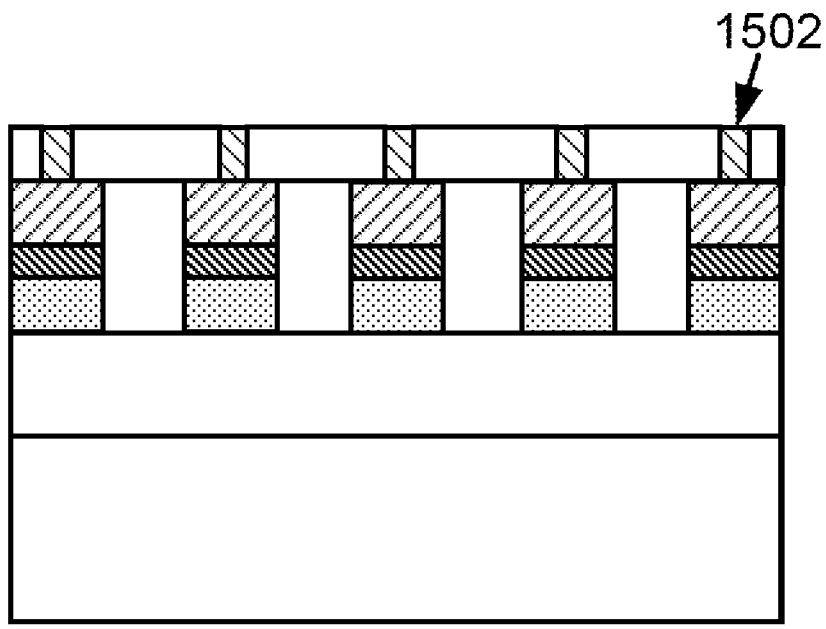

In a specific embodiment, the method subjects the amorphous silicon material to an etch back process to remove the amorphous silicon material from the surface of the second dielectric material and to isolate the amorphous silicon material in the via opening as shown in FIG. 15. As shown, the amorphous silicon material in the via opening forms a switching element 1502 for a resistive switching device in a specific embodiment.

Figure 16:
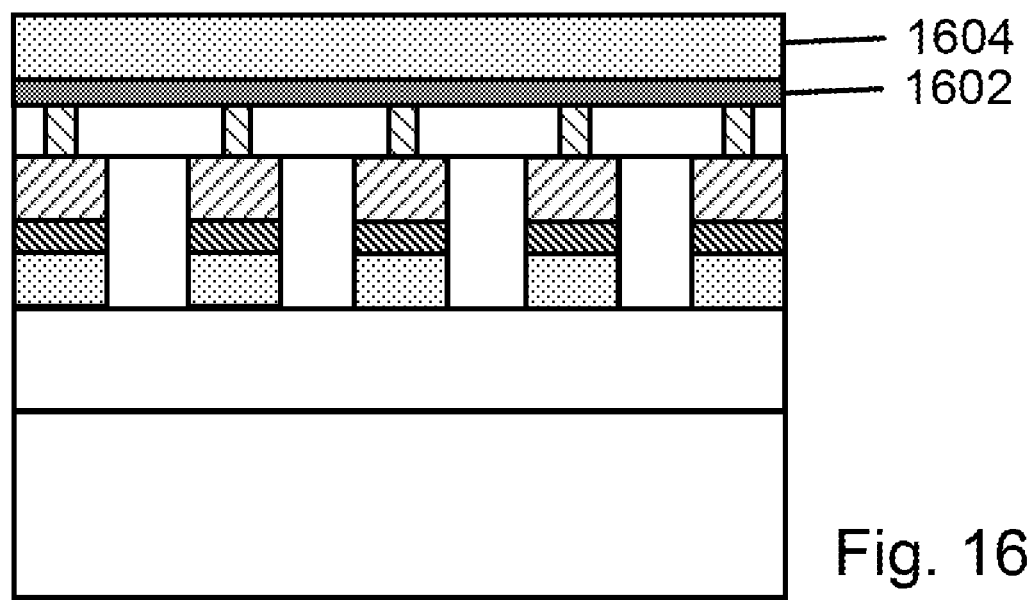

Referring to FIG. 16, in a specific embodiment, the method deposits a metal material 1602 overlying the switching element and the exposed surface region of the second dielectric material. The metal material is configured to have a physical and electrical contact with the switching element in a specific embodiment. For amorphous silicon material as the resistive switching material, the metal material can be silver, gold, platinum, palladium, nickel, or aluminum, and other suitable metal materials. The metal material may be deposited using techniques such as sputtering, chemical vapor deposition, electrochemical deposition, including electroplating, electrodeless plating and a combination depending on the application. The metal material is preferably having a desirable diffusion characteristic in a presence of an electric field provided by an operating voltage in a specific embodiment. The method further deposits a second wiring material 1604 overlying the metal material. The second wiring material can be a suitable conductor material such as tungsten, aluminum, or copper depending on the application.

The second wiring material may be deposited using techniques such as sputtering, chemical vapor deposition, electrochemical deposition, including electroplating, electrodeless plating and a combination depending on the application. The second wiring material can also a diffusion barrier material overlying the metal to prevent the metal material to migrate to other parts of the device to cause shorts and other failure. The diffusion barrier material can be titanium, titanium nitride, tungsten nitride, and the likes depending on the embodiment.

In a specific embodiment, the method includes subjecting the metal material and the second wiring material to a third pattern and etch process to form a second wiring structure. The second wiring structure is configured to have an elongated shape spatially extending in a second direction. The second direction is orthogonal to the first direction to provide for an interconnected crossbar array in a specific embodiment. In a specific embodiment, each of the switching elements is disposed in an intersection region formed from the first wiring structure and the second wiring structure. The method further forms a third dielectric material overlying the second wiring structure and to fill the void regions formed by the pattern and etch process to isolate the second wiring structure in a specific embodiment.

Depending on the application, there can be other variations. For example, the resistive switching device can comprise a pillar structure including the metal material, the amorphous silicon material, and the p+ polysilicon material. The pillar structure is sandwiched between the intersection region formed from the first wiring structure and the second wiring structure. In another embodiment, the metal material can be formed in a second via opening in a dielectric material rather than being formed concurrent with the second wiring structure. Of course one skill in the art would recognize other variations, modifications, and alternatives.

Figure 17:
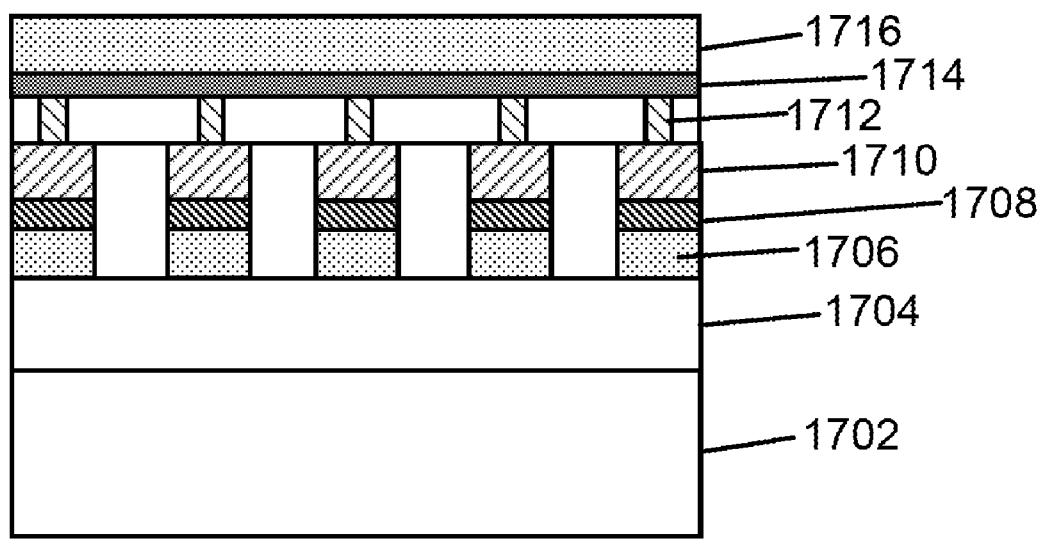

In a specific embodiment, a non-volatile memory device structure is provided as shown in a simplified diagram in FIG. 17. The device includes a semiconductor substrate 1702 having a surface region. The semiconductor substrate can be a single crystal silicon material, a silicon germanium material, a silicon on insulator (commonly called SOI) substrate, or other suitable material depending on the application. A first dielectric material 1704 overlies the surface region of the semiconductor substrate. The first dielectric material can be silicon oxide, silicon nitride, a multilayer dielectric stack such an ONO (silicon oxide on silicon nitride on silicon oxide) stack, a low K dielectric material, a high K dielectric material, and others. In a specific embodiment, the device includes a first wiring structure 1706 overlying the first dielectric material. The first wiring structure includes at least an aluminum material and spatially arranged to extend in a first direction in a specific embodiment. The device includes an alloy material 1708 overlying the first wiring structure and a polycrystalline silicon material 1710 overlying the alloy material in a specific embodiment. The alloy material is formed from a silicon material deposited overlying the aluminum material and the aluminum material in an annealing process in a specific embodiment. The polycrystalline silicon material is characterized by a p+ impurity characteristic derived from an aluminum species from the aluminum material and the silicon material in a specific embodiment.

Referring still to FIG. 17, the device includes a resistive switching material 1712 overlying the polycrystalline silicon material having the p+ impurity characteristic. The resistive switching material includes an amorphous silicon material in a specific embodiment. A metal material 1714 overlies the resistive switching material. For an amorphous silicon material as the resistive switching material, the metal can be silver, gold, platinum, palladium, nickel, aluminum and others. The metal material is has a suitable diffusion characteristic in the amorphous silicon material under an electric field in a specific embodiment. The device includes a second wiring structure 1716 configured to extend in a second direction orthogonal to the first direction in a specific embodiment. As illustrated in FIG. 17, the metal material forms part of the second wring structure in a specific embodiment. In other embodiment, the metal material can be formed in a via structure, in direct contact with the resistive switching material and the second wiring structure. Of course one skilled in the art would recognize other variations, modifications, and alternatives.

In a specific embodiment, the metal material forms a metal region in a portion of the switching material when a first voltage greater than about a threshold voltage is applied to the first wiring structure or the second wiring structure. The metal region causes a change in resistance of the switching material. As merely an example, for amorphous silicon as the switching material and silver as the metal material, a positive bias greater than a threshold voltage applied to the second wiring structure causes a silver region to form in a portion of the amorphous silicon material and causes a change in resistance of the amorphous silicon material. The switching device is now in a low resistance state or an off state. In a specific embodiment, the silver region further includes a filament structure that extends or retracts depending on an operating voltage. That is when a positive bias greater than a first voltage is applied to the second wiring structure of an off state device, the filament extends and the device in is at an on state. A negative bias applied to the second wiring structure of an on state device causes the device to be at the off state again. Of course one skilled in the art would recognize other modifications, variations, and alternatives.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a non-volatile memory device, comprising:
    providing a semiconductor substrate having a surface region;
    forming a first dielectric material overlying the surface region;
    forming a first wiring material comprising at least an aluminum material overlying the first dielectric material;
    forming a silicon material overlying the first wiring material;
    forming an intermix region using at least an anneal process, the intermix region consuming a portion of the silicon material and a portion of the aluminum material, the annealing process causing formation of a first alloy material from the intermix region and a polycrystalline silicon material having a p+ impurity characteristic overlying the first alloy material, the polycrystalline silicon material having the p+ impurity being derived from an aluminum species from the aluminum material and the silicon material;
    forming a first wiring structure from at least a portion of the first wiring material;
    forming a resistive switching element comprising an amorphous silicon material overlying the polycrystalline silicon material having the p+ impurity characteristic; and
    forming a second wiring structure comprising at least a metal material overlying the resistive switching element.

2. The method of claim 1 wherein the semiconductor substrate is a single crystal silicon substrate, a silicon on germanium substrate, or a silicon on insulator (SOI) substrate.

3. The method of claim 1 wherein the first alloy material has a eutectic composition of silicon in aluminum after a cooling process.

4. The method of claim 1 wherein the p+ impurity characteristic is formed from aluminum species.

5. The method of claim 1 wherein the first temperature ranges from about 600 Degree Celsius to about 900 Degree Celsius.

6. The method of claim 1 wherein the first wiring material further comprises at least one adhesion material or a diffusion barrier material interposed between the first dielectric material and the first electrode material.

7. The method of claim 1 wherein the metal material comprises silver, gold, palladium, nickel, platinum, or aluminum or a combination thereof.

8. The method of claim 1 wherein the metal material forms a metal region in a portion of the resistive material upon application of a positive voltage to the second wiring structure.

9. The method of claim 8 wherein the metal region further comprises a filament structure characterized by a length, the filament structure having a length dependent on an operating voltage applied to the first wiring structure or the second wiring structure.

10. The method of claim 9 wherein the resistive switching material is characterized by a resistance dependent on the length of the filament structure.

11. The method of claim 1 wherein forming the first wiring structure comprises subjecting the first wiring material, the alloy material and the p+ polycrystalline silicon material to a first pattern and etch process to form a plurality of first structures, each of the plurality of the first structure comprising a first wiring structure comprising at least the first wiring material being configured to spatially extend in a first direction.

12. The method of claim 1 further comprises subjecting the polycrystalline silicon material having the p+ impurity characteristic, the amorphous silicon material, and the metal material to a second pattern and etch process to form a plurality of pillar structures.

13. The method of claim 1 further comprises subjecting the second wiring material in to a third pattern and etch process to form a second wiring structure, the second wiring structure is configured to spatially extend in a second direction perpendicular to the first direction.

14. The method of claim 1 wherein the polycrystalline silicon material having a p+ impurity characteristic is configured to be a contact material to control an interfacial characteristic between the amorphous silicon material and the first wiring material.

15. The method of claim 1 further comprises:
    forming a thickness of a second dielectric material overlying the first structure, the thickness of the second dielectric material having a surface region;
    subjecting the thickness of the second dielectric material to a second pattern and etch process to form a via opening in the thickness of the second dielectric material;
    exposing a surface region of the polycrystalline silicon material having the p+ impurity characteristic;
    depositing the resistive switching material comprising the amorphous silicon material overlying the surface region of the second dielectric material and to fill the via opening;
    subjecting the resistive switching material to an etch back process to remove the resistive switching material from the surface region of the second dielectric material to isolated the resistive switching material in the via opening and forming a switching element from the resistive switching material in the via opening; and
    depositing the metal material overlying the resistive switching material and the second wiring material overlying the second switching material; and
    subjecting the metal material and the second wiring material to a third pattern and etch process to from a plurality of a second wiring structures extending in a second direction perpendicular to the first direction.

16. A non-volatile memory device, comprising:
    a semiconductor substrate having a surface region;
    a first dielectric material overlying the surface region;
    a first wiring structure comprising at least an aluminum material overlying the first dielectric material;
    a first alloy material formed from a silicon material and the aluminum material overlying the aluminum material;
    a polycrystalline silicon material having a p+ impurity characteristic overlying the first alloy material, the polycrystalline silicon material having the p+ impurity being derived from the silicon material and an aluminum species from the aluminum material;

a resistive switching element comprising an amorphous silicon material overlying the polycrystalline silicon material having the p+ impurity characteristic; and a second wiring structure comprising at least a metal material overlying the resistive switching element.

17. The device of claim 16 wherein the second wiring structure is spatially configured to be orthogonal to the first wiring structure.

18. The device of claim 16 wherein the semiconductor substrate is a single crystal silicon substrate, a silicon germanium substrate or a silicon on insulator (SOI) substrate.

19. The device of claim 16 wherein the first dielectric material comprises silicon oxide, silicon nitride, silicon oxide on silicon nitride on silicon oxide (ONO) stack, high K dielectric, low K dielectric, or spin on glass.

20. The device of claim 16 wherein the first alloy material comprises an eutectic composition of silicon in aluminum.

21. The device of claim 16 wherein metal material comprises silver, gold, palladium, nickel, platinum, or aluminum or a combination thereof.

22. The device of claim 16 wherein the metal material forms a metal region in a portion of the amorphous silicon material upon application of a threshold voltage, the metal region comprises a filament structure having a length dependent on an operating voltage of the device.

23. The device of claim 16 wherein the second wiring structure further comprises a conductor material portion that forms an interconnecting structure.

24. The device of claim 23 wherein the conductor material comprises tungsten, aluminum, or copper.

25. The device of claim 16 wherein the polycrystalline silicon material having the p+ impurity characteristic provides for a contact material between the amorphous silicon material and the aluminum material.

* * * * *